United States Patent
Liao et al.

(10) Patent No.: US 10,879,634 B1
(45) Date of Patent: Dec. 29, 2020

(54) PLUG CONNECTOR HAVING PROTECTIVE MEMBER FOR REPLACING GOLD FINGER ON CIRCUIT BOARD

(71) Applicant: BELLWETHER ELECTRONIC CORP., Taoyuan (TW)

(72) Inventors: Yen-Jang Liao, Taoyuan (TW); Wei-Min Lin, Taoyuan (TW)

(73) Assignee: BELLWETHER ELECTRONIC CORP., Taoyuan (TW)

(*) Notice: Subject to any disclaimer, the term of this patent is extended or adjusted under 35 U.S.C. 154(b) by 0 days.

(21) Appl. No.: 16/727,939

(22) Filed: Dec. 27, 2019

(30) Foreign Application Priority Data

Jun. 18, 2019 (TW) .............................. 108207744 U (51) Int. Cl.

| H01R 13/6596 | (2011.01) |
| --- | --- |
| H01R 12/57 | (2011.01) |
| H05K 1/18 | (2006.01) |
| H01R 12/77 | (2011.01) |
| H05K 3/34 | (2006.01) |
| H01R 13/6587 | (2011.01) |
| H01R 12/72 | (2011.01) |

(52) U.S. Cl.
CPC .......... *H01R 12/57* (2013.01); *H01R 12/721* (2013.01); *H01R 12/77* (2013.01); *H01R 13/6587* (2013.01); *H01R 13/6596* (2013.01); *H05K 1/18* (2013.01); *H05K 3/34* (2013.01)

(58) Field of Classification Search
CPC ...... H01R 12/57; H01R 12/721; H01R 12/77; H01R 13/6587; H01R 13/6596; H05K 1/18; H05K 3/34

USPC .......................................................... 439/83
See application file for complete search history.

(56) References Cited

U.S. PATENT DOCUMENTS

| 5,188,536 | A  | * | 2/1993 | Ganthier | .............. | H01R 12/714 |
| | | | | | | 439/406 |
| 7,175,444 | B2 | * | 2/2007 | Lang | ...................... | H01R 43/00 |
| | | | | | | 439/76.1 |
| 7,189,098 | B1 | * | 3/2007 | Wu | ...................... | H01R 13/405 |
| | | | | | | 439/352 |
| 7,226,314 | B2 | * | 6/2007 | Lang | .................... | H01R 13/629 |
| | | | | | | 439/607.04 |
| 7,232,329 | B1 | * | 6/2007 | Wu | ........................ | H01R 12/62 |
| | | | | | | 439/358 |

(Continued)

*Primary Examiner* — Abdullah A Riyami
*Assistant Examiner* — Vladimir Imas
(74) *Attorney, Agent, or Firm* — Li & Cai Intellectual Property Office (57) ABSTRACT

A plug connector having a protective member replacing a gold finger on a circuit board includes an insulation base, a cable terminal block, and a grip. The insulation base includes a top wall, a bottom wall, and two side walls. The cable terminal block includes at least one cable including multiple conductors. The circuit board includes a contact section and a solder section, and the width of the solder section is greater than the width of the contact section. Two stopping and grounding parts are respectively formed on both sides of the solder section adjacent to the contact section. The circuit board includes multiple conductive pads on a surface of the contact section and multiple solder pads on a surface of the solder section. The conductors of the cable are separately soldered to solder pads. The protective member is clipped to the contact section of the circuit board.

10 Claims, 13 Drawing Sheets

(56) References Cited

U.S. PATENT DOCUMENTS

| | | | | |
|---|---|---|---|---|
| 7,261,582 B2* | 8/2007 | Wu | H01R 13/506 | 439/352 |
| 7,267,575 B1* | 9/2007 | Hwang | H01R 13/6593 | 439/497 |
| 7,291,034 B2* | 11/2007 | Wu | H01R 12/53 | 439/358 |
| 7,303,438 B2* | 12/2007 | Dawiedczyk | H01R 12/7005 | 439/358 |
| 7,344,409 B2* | 3/2008 | Lang | H01R 12/7005 | 439/372 |
| 7,410,365 B2* | 8/2008 | Wu | H01R 13/512 | 439/358 |
| 7,448,897 B2* | 11/2008 | Dawiedczyk | H01R 13/6275 | 439/357 |
| 7,520,774 B2* | 4/2009 | Watanabe | H01R 13/65918 | 439/493 |
| 7,546,634 B2* | 6/2009 | Wu | G06F 21/80 | 361/737 |
| 7,601,010 B1* | 10/2009 | Wu | H01R 13/6658 | 439/76.1 |
| 7,798,821 B2* | 9/2010 | Liu | H01R 13/6658 | 439/76.1 |
| 7,857,650 B1* | 12/2010 | Wu | H01R 13/6275 | 439/352 |
| 7,891,986 B2* | 2/2011 | Wu | H01R 13/512 | 439/76.1 |
| 7,909,661 B2* | 3/2011 | Wu | H01R 12/721 | 439/701 |
| 7,997,909 B2* | 8/2011 | Xu | H01R 13/6594 | 439/76.1 |
| 8,172,610 B2* | 5/2012 | Kurachi | H01R 12/79 | 439/578 |
| 8,454,381 B2* | 6/2013 | Wu | H01R 13/506 | 439/352 |
| 8,550,849 B2* | 10/2013 | Yamaji | H01R 12/725 | 439/607.41 |
| 8,858,249 B2* | 10/2014 | Honda | H01R 12/88 | 439/260 |
| 8,888,534 B2* | 11/2014 | Toda | H01R 12/7058 | 439/630 |
| 10,096,944 B2* | 10/2018 | Huang | H01R 13/6582 | |
| 10,511,127 B2* | 12/2019 | Chang | H01R 13/6584 | |
| 10,756,468 B2* | 8/2020 | Liao | H01R 13/6272 | |
| 2006/0160399 A1* | 7/2006 | Dawiedczyk | H01R 12/716 | 439/374 |
| 2012/0156938 A1* | 6/2012 | Zhang | H01R 24/60 | 439/660 |
| 2012/0184126 A1* | 7/2012 | Chen | H01R 13/504 | 439/345 |

* cited by examiner

PLUG CONNECTOR HAVING PROTECTIVE MEMBER FOR REPLACING GOLD FINGER ON CIRCUIT BOARD

CROSS-REFERENCE TO RELATED PATENT APPLICATION

This application claims the benefit of priority to Taiwan Patent Application No. 108207744, filed on Jun. 18, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a plug connector having a protective member for replacing a gold finger on a circuit board, and more particularly to a plug connector that can be plugged into a socket connector. The plug connector includes a circuit board, and the circuit board is provided with a gold finger as a conductor for electrical connection to the socket connector. The plug connector also includes a protective member for protecting the circuit board, and the protective member can replace the gold finger of the circuit board and is in electrical contact with a terminal of the socket connector.

BACKGROUND OF THE DISCLOSURE

Electrical connectors have been commonly used to transmit signals or power. With the miniaturization of electrical connectors and the development of high-speed transmission capabilities, a standard specification association was founded in the industry to gather opinions, so that a connector with standardized specification can be developed, e.g., a slim serial attached SCSI plug connector. A conductor used for transmission has been designed to be disposed on a circuit board, i.e., a gold finger.

However, when the plug connector is to be plugged into a socket with a metal shell, if a plug-connection performed by a user is inaccurate, a circuit board substrate can be easily cut and damaged by the metal shell, and the gold finger on the circuit board can be damaged from scratching.

SUMMARY OF THE DISCLOSURE

In response to the above-referenced technical inadequacies, the present disclosure provides a plug connector having a mechanism for protecting a circuit board, so as to avoid damaging a circuit board substrate and a gold finger thereon by a metal shell of a socket.

In response to the above-referenced technical inadequacies, the present disclosure provides a plug connector, in which the mechanism for protecting the circuit board can replace a gold finger of a circuit board and to be in electrical contact with a terminal of the socket, so as to reduce a size of the circuit board such that a size of an interface plug can be maintained in conformity to standard specifications.

In one aspect, the present disclosure provides a plug connector having a protective member replacing a gold finger of a circuit board. The plug connector includes an insulation base, a cable terminal block, a circuit board, a grip, and the protective member. The insulation base includes a top wall, a bottom wall, and a pair of side walls that jointly surround to form an accommodating space in an interior thereof along an insertion direction of the plug connector. The cable terminal block includes at least one cable, and each of the at least one cable includes a plurality of conductors. The circuit board includes a contact section and a solder section, in which the solder section is connected with the contact section, the width of the solder section is greater than the width of the contact section, and a pair of stopping and grounding parts are respectively formed on both sides of the solder section adjacent to the contact section. The circuit board also includes a plurality of conductive pads located on at least one surface of the contact section and a plurality of solder pads located on at least one surface of the solder section. A ground pad is disposed on at least one surface of each of the stopping and grounding parts, in which the contact section protrudes from a front edge of the insulation base and exposes the conductive pads. The conductors of the at least one cable are separately soldered to the plurality of solder pads. The location of the ground pads protruding from two sides of the contact section. The grip is fixed to the insulation base. The protective member is clipped to the contact section of the circuit board, and includes a transverse arm and a pair of longitudinal arms. The pair of longitudinal arms is connected to both ends of the transverse arm, and each end of the pair of longitudinal arms are separately soldered to the solder pads of the pair stopping and grounding part.

In certain embodiments, the present disclosure provides the plug connector having the protective member replacing the gold finger of the circuit board, in which the number of the conductive pads is less than the number of the solder pads, and the ground pad is aligned with two outermost solder pads among the plurality of solder pads.

In certain embodiments, the present disclosure provides the plug connector including the protective member replacing the gold finger of the circuit board, in which a plurality of connection structures are respectively formed at each end of the longitudinal arms, and the connection structures are separately soldered to the ground pads on a top and a bottom surface of the pair of stopping and grounding parts.

In certain embodiments, the present disclosure provides the plug connector including the protective member replacing the gold finger of the circuit board, in which each of the connection structures includes a widened part and a pair of solder parts. The widened part is connected to the end of the longitudinal arm, and the pair of solder parts respectively extend from two sides of the widened part in a direction parallel to the longitudinal arm.

In certain embodiments, the present disclosure provides the plug connector including the protective member replacing the gold finger of the circuit board, in which the protective member further includes a pair of positioning side panels. Each of the positioning side panel respectively extends from an outer side of the longitudinal arm of the protective member, in which one gap is formed between one of the pair of positioning side panels and one of the pair of longitudinal arms, and one another gap is formed between another one of the pair of positioning side panels and another one of the pair of longitudinal arms.

Therefore, one beneficial effect of the present disclosure is that the plug connector having the protective member replacing the gold finger of the circuit board of the present disclosure includes the protective member located on a front and two sides of the circuit board, so that the protective member can not only protect the circuit board, but also provide a grounding effect by connecting to the ground line of the circuit board. The mechanism for protecting the circuit board can replace the gold finger of the circuit board and be in electrical contact with the terminal of the socket so as to reduce the size of the circuit board, such that the size of the interface plug can be maintained in conformity to the standard specifications.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides a plug connector 100 having a protective member replacing a gold finger of a circuit board. The plug connector 100 can be inserted into a socket connector 9 along an insertion direction of the plug connector (exemplified in FIG. 4). The plug connector 100 includes an insulation base 10, a cable terminal block (20, 20), a circuit board 30, a protective member 50, and a grip 60. The insulation base 10 includes a top wall 12a, a bottom wall 12b, and a pair of side walls 14 that jointly surround to form an accommodating space in an interior thereof along the insertion direction of the plug connector. In the present embodiment, the cable terminal block includes two cables 20 corresponding to each other; however, the present disclosure is not limited thereto, and the number of the cable 20 can be one or more. Each cable 20 includes a plurality of conductors 22, and the conductors 22 are separately soldered to a rear end of the circuit board 30. In the present embodiment, the two cables 20 have the same amount of the conductors 22, but the present disclosure is not limited thereto. The cable terminal block is held in the accommodating space of the insulation base 10, and a front end of the circuit board 30 is exposed from a front end of the insulation base 10.

Figure 1:
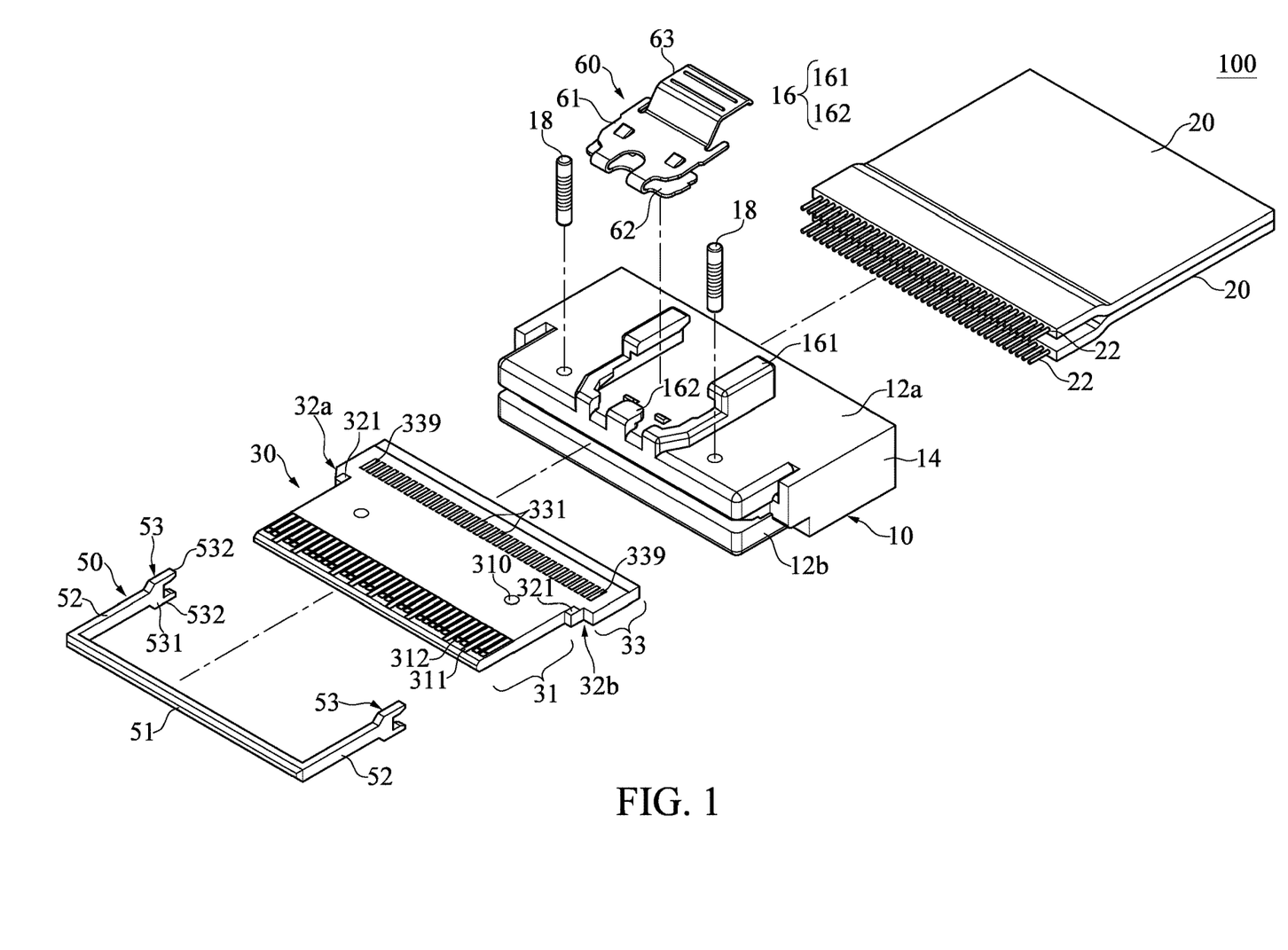
FIG. 1 is an exploded view of a plug connector according to a first embodiment of the present disclosure.
Figure 2:
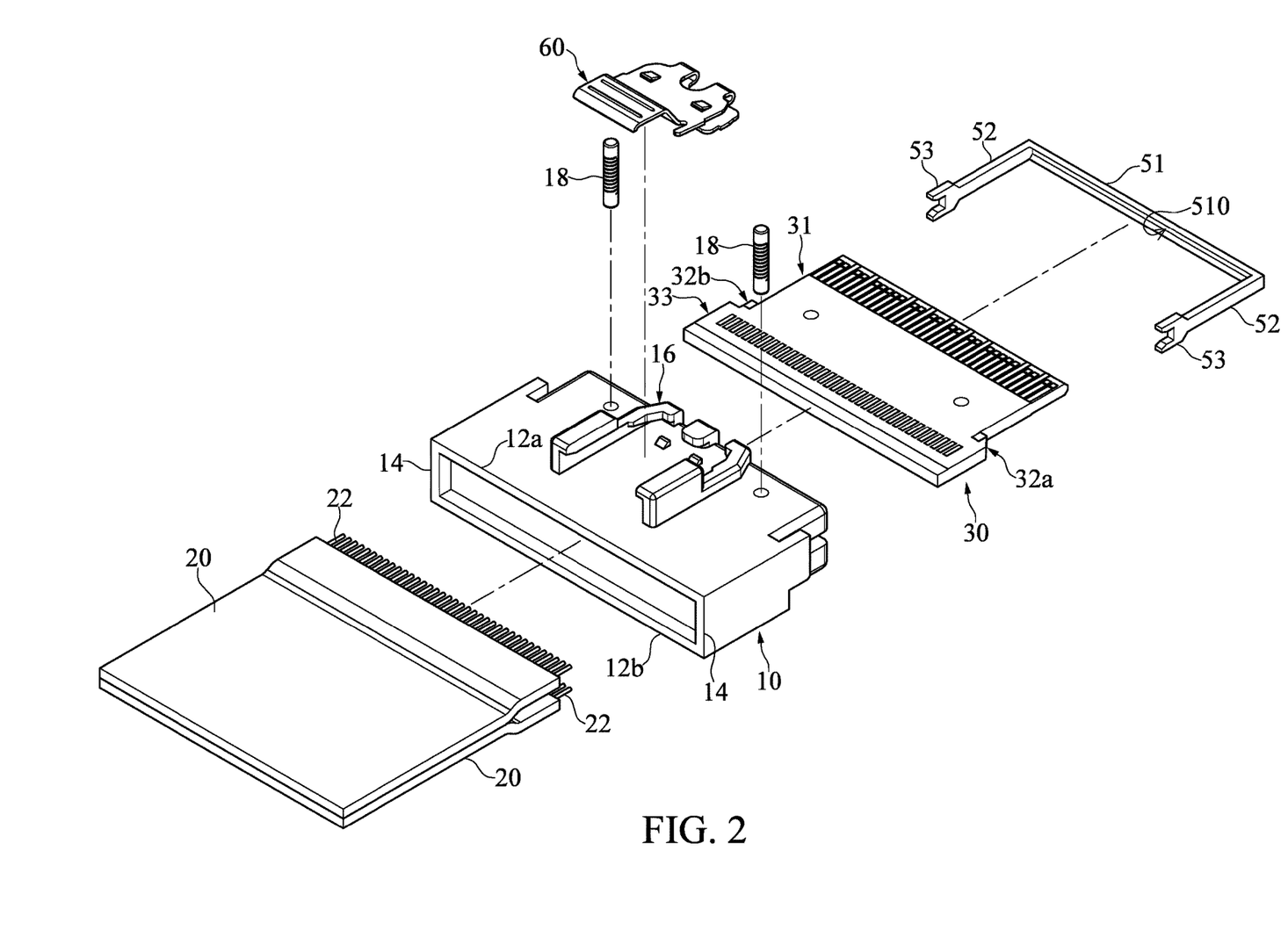
FIG. 2 is another exploded view of the plug connector according to the first embodiment of the present disclosure.
Figure 3:
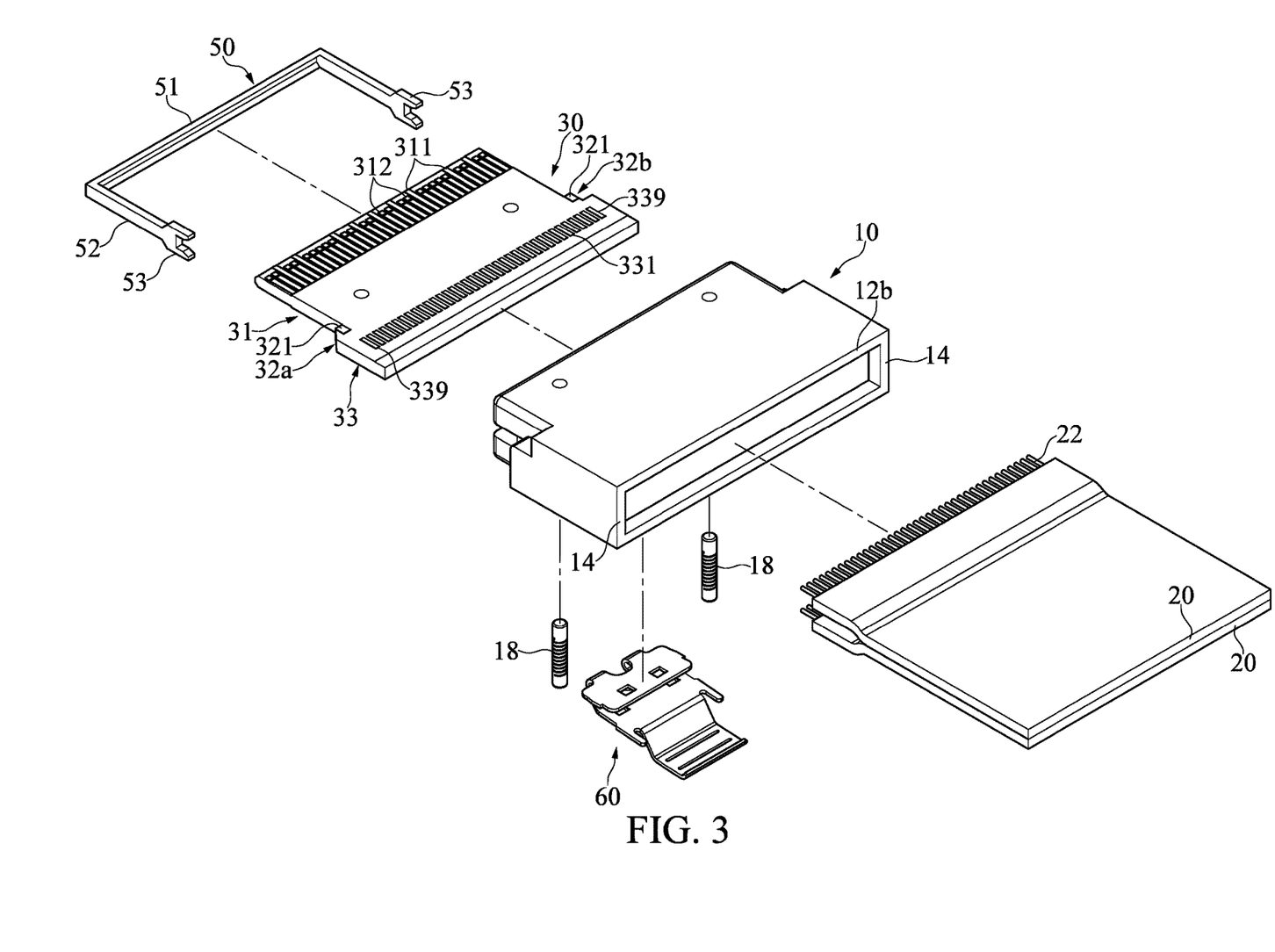
FIG. 3 is a bottom exploded view of the plug connector according to the first embodiment of the present disclosure.

The circuit board 30 includes a contact section 31 and a solder section 32. The solder section 32 is connected with the contact section 31, in which the contact section 31 is close to the front end of the circuit board 30, and the solder section 32 is close to the rear end of the circuit board 30. The width of the solder section 32 is greater than the width of the contact section 31, and a pair of stopping and grounding parts 32a, 32b are formed on both sides of the solder section 32 adjacent to the contact section 31. In the present embodiment, the pair of stopping and grounding parts 32a, 32b are respectively inclined and stepped, and the stopping and grounding parts 32a, 32b abut against the inner side of the pair of side walls 34 of the insulation base 10, respectively. Different shapes of the two stopping and grounding parts 32a, 32b can be used to identify the direction of the circuit board 30, but the present disclosure is not limited thereto.

The circuit board 30 includes a plurality of conductive pads 311, 312 (i.e., gold finger) located on a top and a bottom surface of the contact section 31, and a plurality of solder pads 331, 339 located on a top and a bottom surface of the solder section 33. However, the present disclosure is not limited thereto. The plurality of conductive pads 311, 312 can be disposed on only one of the top and the bottom surfaces of the contact section 31, and the plurality of solder pads 331, 339 can be disposed on only one of the top and the bottom surfaces of the solder section 33. The length of the conductive pad 311 is greater than the length of the conductive pad 32. The long conductive pad 311 is mainly used for grounding, and the short conductive pad 312 is used for signal transmission. A ground pad 321 is disposed on each of a top and a bottom surface of the pair of stopping and grounding parts 32a, 32b, however, the present disclosure is not limited thereto. The ground pad 321 can be disposed on only one of the top and the bottom surfaces of the pair of stopping and grounding parts 32a, 32b, in which, the contact section 31 protrudes from a front edge of the insulating base 10 and exposes the plurality of conductive pads 311, 312. The plurality of conductors 22 of the two cables 20 can be respectively soldered to the plurality of solder pads 331, 339. The number of the conductive pads 311, 312 is less than the number of the solder pads 331, 339, and the ground pad 321 is aligned with two outermost solder pads 339 and protrudes from both sides of the contact section 31. Specifically, in the present embodiment, the ground pads 321 of the stopping and grounding parts 32a, 32b on both sides of the same surface replace two conductive pads, that is, the number of conductive pads 311, 312 on the same surface is less than that of the solder pads 331, 339 by an amount of two.

In the present embodiment, to fix the circuit board 30, the plug connector further includes a pair of fixing pins 18, and the pair of fixing pins 18 respectively penetrate the top wall 12a and the bottom wall 12b of the insulation base 10 and a fixing hole 310 on the circuit board 30 so as to fix the circuit board 30 to the insulation base 10. But the present disclosure is not limited thereto. The number of fixing pins 18 can be one or more.

Referring to FIG. 1, the protective member 50 is clipped to the contact section 31 of the circuit board 30, and the protective member 50 includes a transverse arm 51 and a pair of longitudinal arms 52. The pair of longitudinal arms 52 are connected to two ends of the transverse arm 51 and are substantially U-shaped. The transverse arm 51 abuts against a front edge of the circuit board 30, and the pair of longitudinal arms 52 respectively abut against two side edges of the contact section 31. In addition, each end of the pair of longitudinal arms 52 is respectively soldered to the ground pad 321 of the pair of stopping and grounding parts 32a, 32b so that the protective member 50 is grounded. The grip 60 is fixed to the top wall 12a of the insulation base 10, and the grip 60 has an operation part 63 extending upward. In the present embodiment, the thickness of the protective member 50 is approximately equal to the thickness of the circuit board 30, so as to avoid scratching the circuit board 30 when the plug connector 100 is inserting into the socket connector 9.

As shown in FIG. 2, more specifically, a groove 510 is formed on an inner side surface of the transverse arm 51 of the protective member 50 in the present embodiment, and a front end surface of the contact section 31 of the circuit board 30 forms a corresponding bevel. The groove 510 abuts the front end surface of the contact section 31 so as to help holding the transverse arm 51 at the front end of the contact section 31, and prevent the transverse arm 51 from being upwardly or downwardly displaced.

In the present embodiment, an inner side surface of the pair of longitudinal arms 52 of the protective member 50 abuts against two sides of the contact section 31, in which, a connection structure 53 is formed on each end of the longitudinal arms 52, and the connection structures 53 are separately soldered to the ground pads 321 on the top and the bottom surfaces of the stopping and grounding parts 32a, 32b. In other words, each connection structure 53 corresponds to one stopping and grounding part (32a or 32b), and is soldered to two ground pads 321 on the top and the bottom surface of the circuit board 30. More specifically, in the present embodiment, each connection structure 53 has a widened part 531 and a pair of solder parts 542, the widened part 531 is connected to the end of the longitudinal arm 52, and the pair of solder parts 542 respectively extend from two sides of the widened part 531 in a direction parallel to the longitudinal arm 52 and are substantially fork-shaped. The pair of solder parts 542 are respectively soldered to two ground pads 321 on the top and bottom surfaces of the circuit board 30 so as to fix the protective member 50 to the circuit board 30, and prevent the protective member 50 from being forwardly or backwardly displaced.

Referring to FIG. 1 to FIG. 4, the grip 60 is fixed on the top wall 12a of the insulation base 10, and the grip 60 has an upper panel 61, a lower panel 62, and the operation part 63 extending upward from the upper panel 61. A front end of the upper panel 61 is bent to connect with the lower panel 62. The grip can be formed by stamping a metal panel. The lower panel 62 of the grip 60 is fixed on the top wall 12a of the insulation base 10.

As shown in FIG. 1, to fix the grip 60, a mounting structure 16 is formed on the top wall 12a of the insulation base 10 in the present embodiment. The mounting structure 16 includes a pair of limiting walls 161 and a front fixing block 162. Both sides of the upper panel 61 of the grip 60 are fixed to the pair of limiting walls 161, and the front ends of the upper plate 61 and the lower plate 62 are recessed and stopped at the front fixing block 162.

Figure 4:
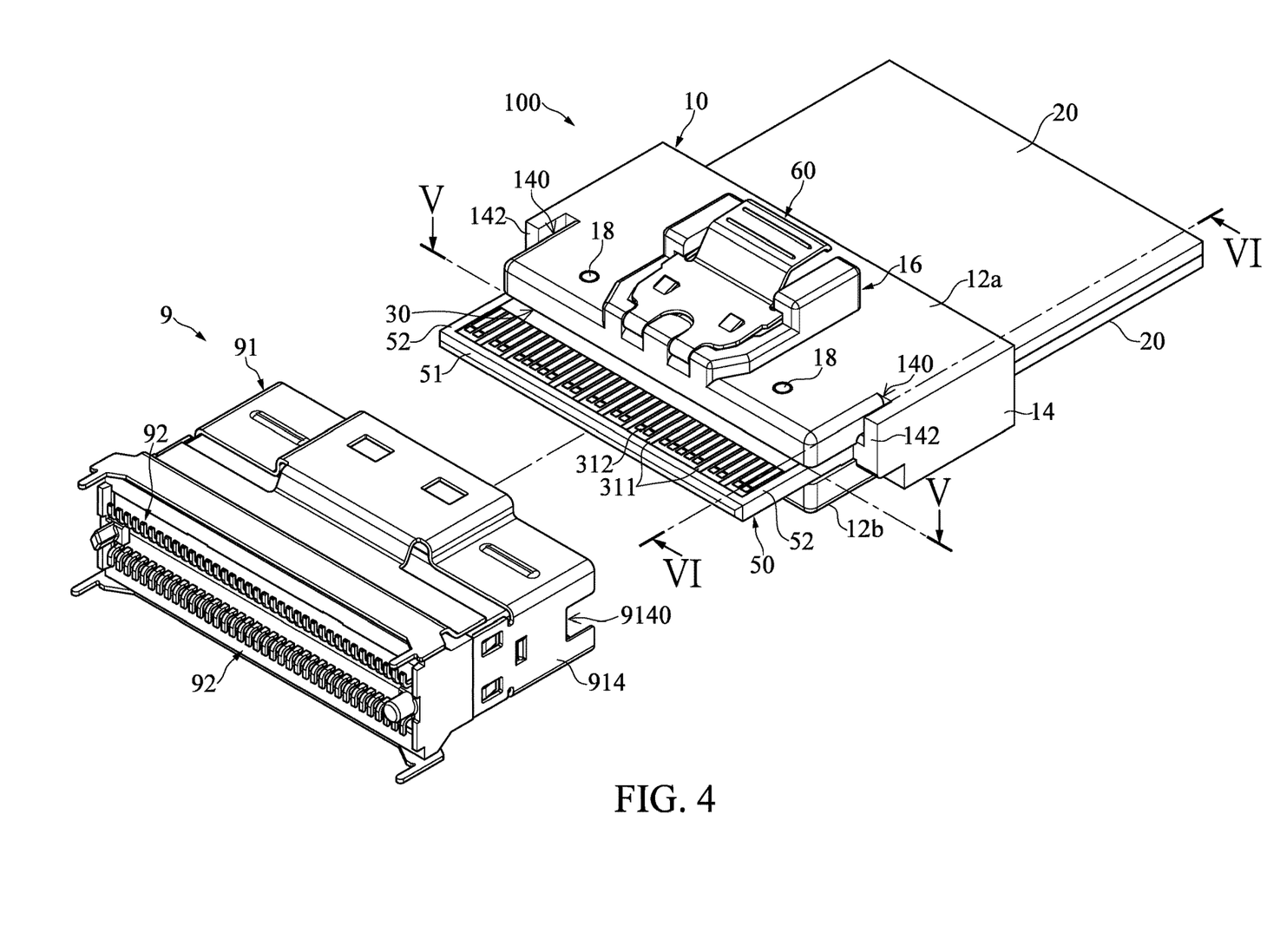
FIG. 4 is a perspective view of the plug connector and a socket according to the first embodiment of the present disclosure.
Figure 5:
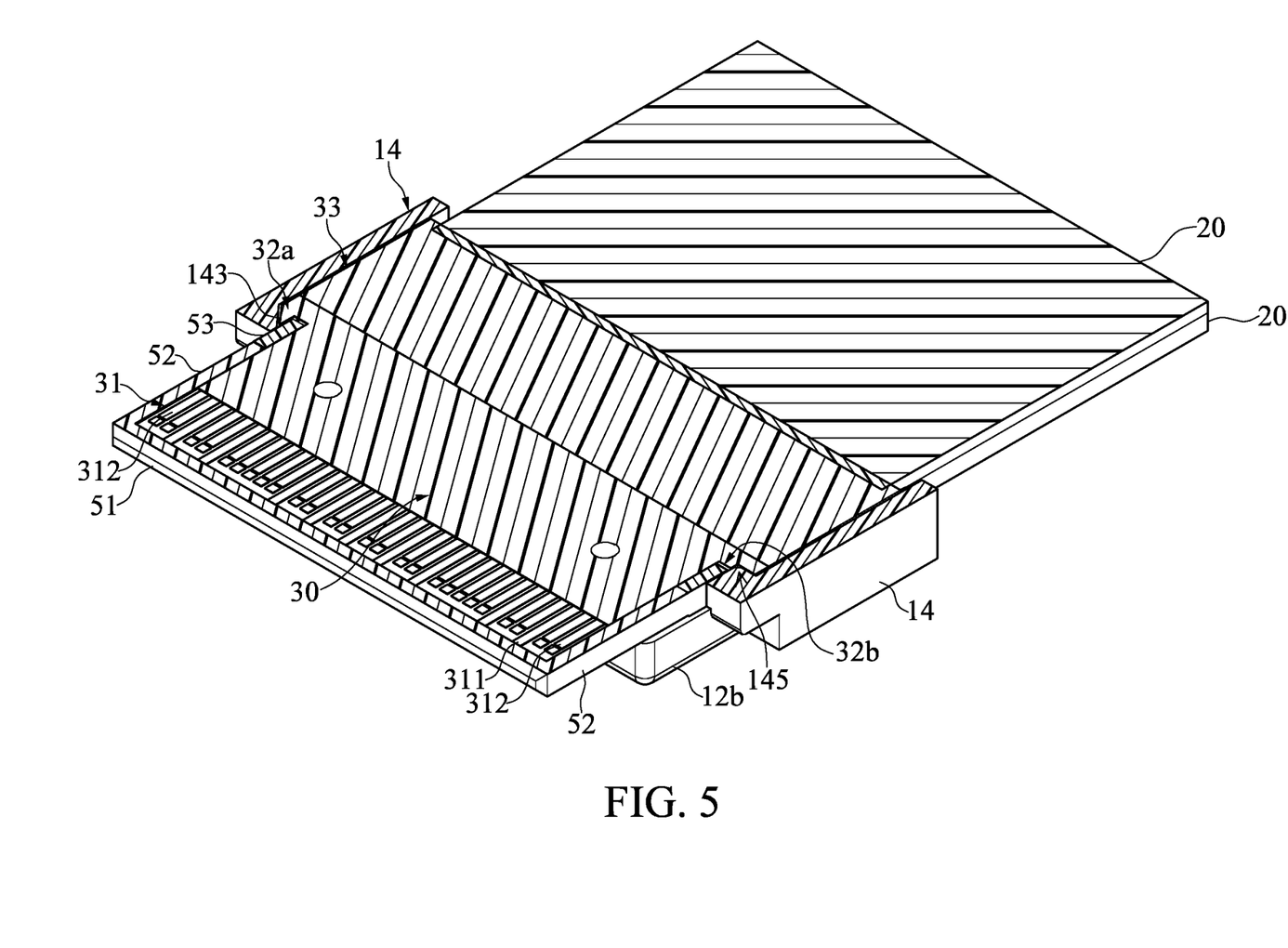
FIG. 5 is a sectional view taken along line V-V of FIG. 4.
Figure 6:
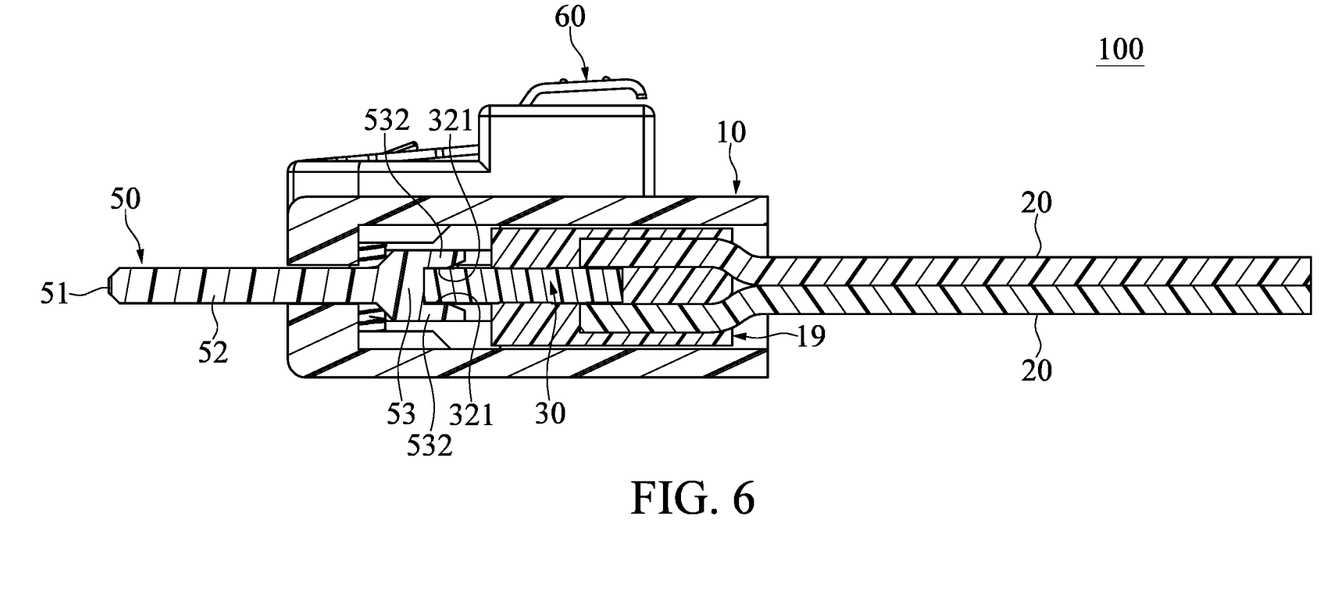
FIG. 6 is a sectional view taken along line VI-VI of FIG. 4.

As shown in FIG. 4, FIG. 5, and FIG. 6, FIG. 4 is a perspective view of the plug connector 100 and the socket connector 9 according to the present embodiment; FIG. 5 is a sectional view taken along line V-V of FIG. 4; FIG. 6 is a sectional view taken along line VI-VI of FIG. 4. In an assembly process of the plug connector 100 of the present embodiment, the circuit board 30 is inserted into the accommodating space of the insulation base 10 from a rear side of the insulation base 10 along with the cable terminal block. A stop block 143, 145 is formed on each inner side of the pair of side walls 14 of the insulation base 10, and the pair of stopping and grounding parts 32a, 32b of the circuit board 30 are stopped by the stop blocks 143, 145, respectively. In addition, the pair of fixing pins 18 penetrate the insulation base 10 and the circuit board 30 so as to firmly fix the circuit board 30 in the insulation base 10 and prevent the circuit board 30 from being displaced. As shown in FIG. 6, in the present embodiment, a packaging member 19 (e.g., a resin) can be further filled into the accommodating space of the insulation base 10 to fix and protect the cable terminal block.

Once the plug connector 100 is assembled, about half of the contact section 31 of the circuit board 30 is exposed from a front edge surface of the insulation base 10, and the conductive pads 311, 312 are completely exposed. The protective member 50 is located at the front end and both sides of the circuit board 30. The protective member 50 can protect the conductive pads 311, 312 of the circuit board 30 from being damaged by scratching during an insertion process. In addition, the protective member 50 is connected to a ground line of the circuit board 30 (exemplified as the ground pad 321 in FIG. 1 and FIG. 2), and the longitudinal arms 52 on both sides of the protective member 50 can provide a grounding effect. A guiding bevel is formed at a front end of the transverse arm 51 so as to help the transverse arm 51 to be smoothly inserted into the socket connector 9. As shown in FIG. 5, the width of the longitudinal arm 52 is approximately equal to the width of the long conductive pad 311 plus an interval distance between two adjacent conductive pads 311. An interval distance between the longitudinal arm 52 and an outermost short conductive pad 312 is approximately equal to the interval distance between two adjacent conductive pads 311. A front end of the long conductive pad 311 can be in contact with the transverse arm 51 of the protective member 50.

The socket connector 9 includes a housing 91 and two rows of terminals 92. A positioning recess 9140 is formed on each of two side panels 914 of the housing 91. A positioning engagement part 142 is formed at each front end of the pair of side walls 34 of the insulation base 10 and is substantially L-shaped. A retaining groove 140 is formed between the positioning engagement part 142 and the top wall 14a. When the plug connector 100 and the socket connector 9 are mated, a pair of positioning engagement parts 142 is engaged into the positioning recess 9140 of the socket connector 9.

Figure 7:
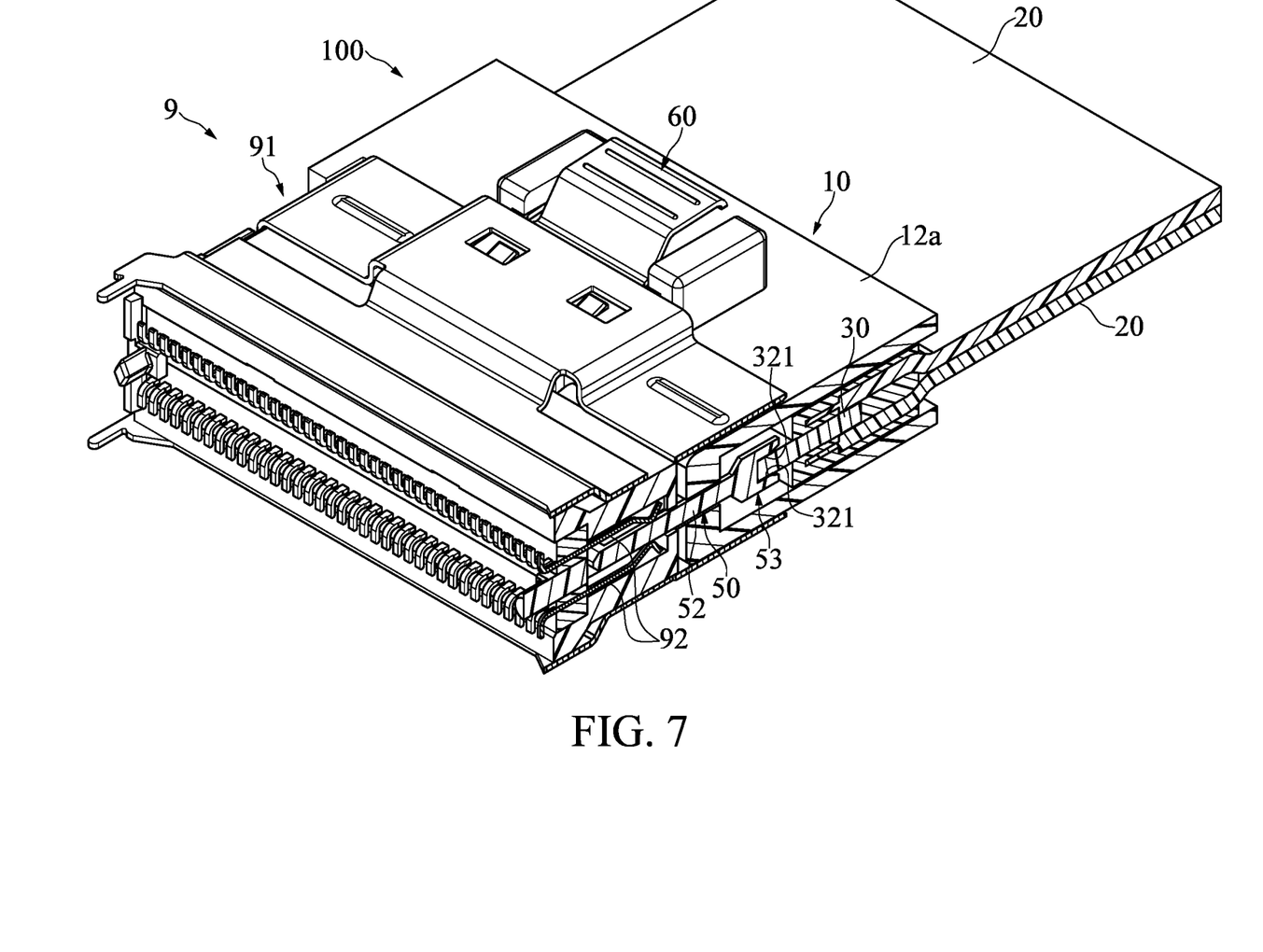
FIG. 7 is a sectional view of the plug connector and the socket according to the first embodiment of the present disclosure.

As shown in FIG. 7, corresponding to the position of the (outermost) terminal 92 of the socket connector 9, the circuit board 30 is not provided with the conductive pad (gold finger); instead, the conductive pad (gold finger) of the circuit board 30 is replaced by the protective member 50 (i.e., the longitudinal arm 52 of the protective member 50). During an insertion process between the plug connector 100 and the socket connector 9, the terminal 92 of the socket connector 9 is in contact with the protective member 50 first, so that the protective member 50 can protect the front end of the circuit board 30. When the plug connector 100 and the socket connector 9 are mated, the terminal 92 (exemplified as the outermost terminal in FIG. 7) of the socket connector 9 is in electrical contact with the longitudinal arm 52 of the protective member 50, and the (outermost) terminal 92 of the socket connector 9 is connected to the ground line of the circuit board 30 through the connection structure 53 of the ground line. In other words, the terminal 92 of the socket connector 9 is in electrical contact with the ground line of the circuit board 30 through the protective member 50.

Second Embodiment

Figure 8:
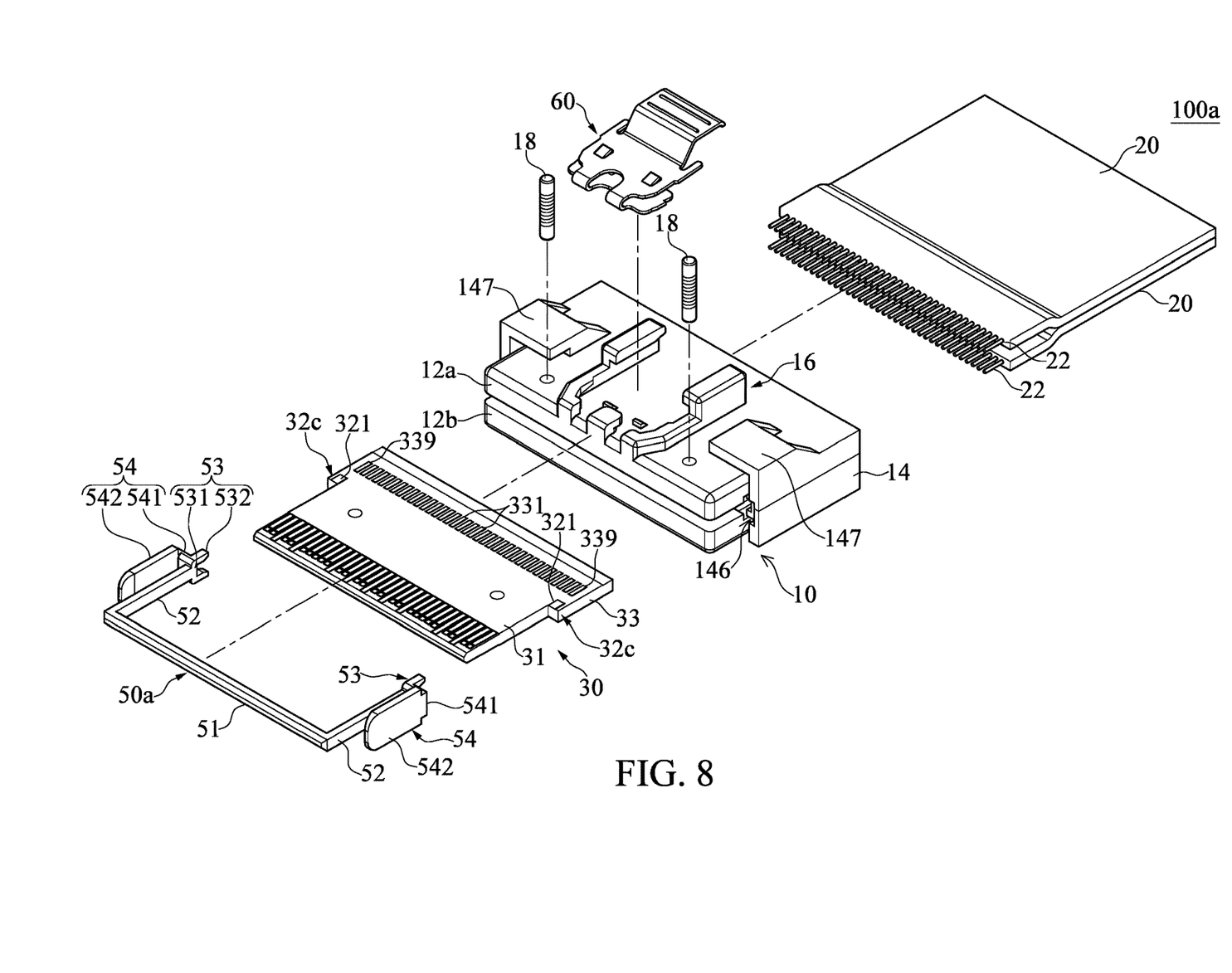
FIG. 8 is an exploded view of a plug connector according to a second embodiment of the present disclosure.
Figure 9:
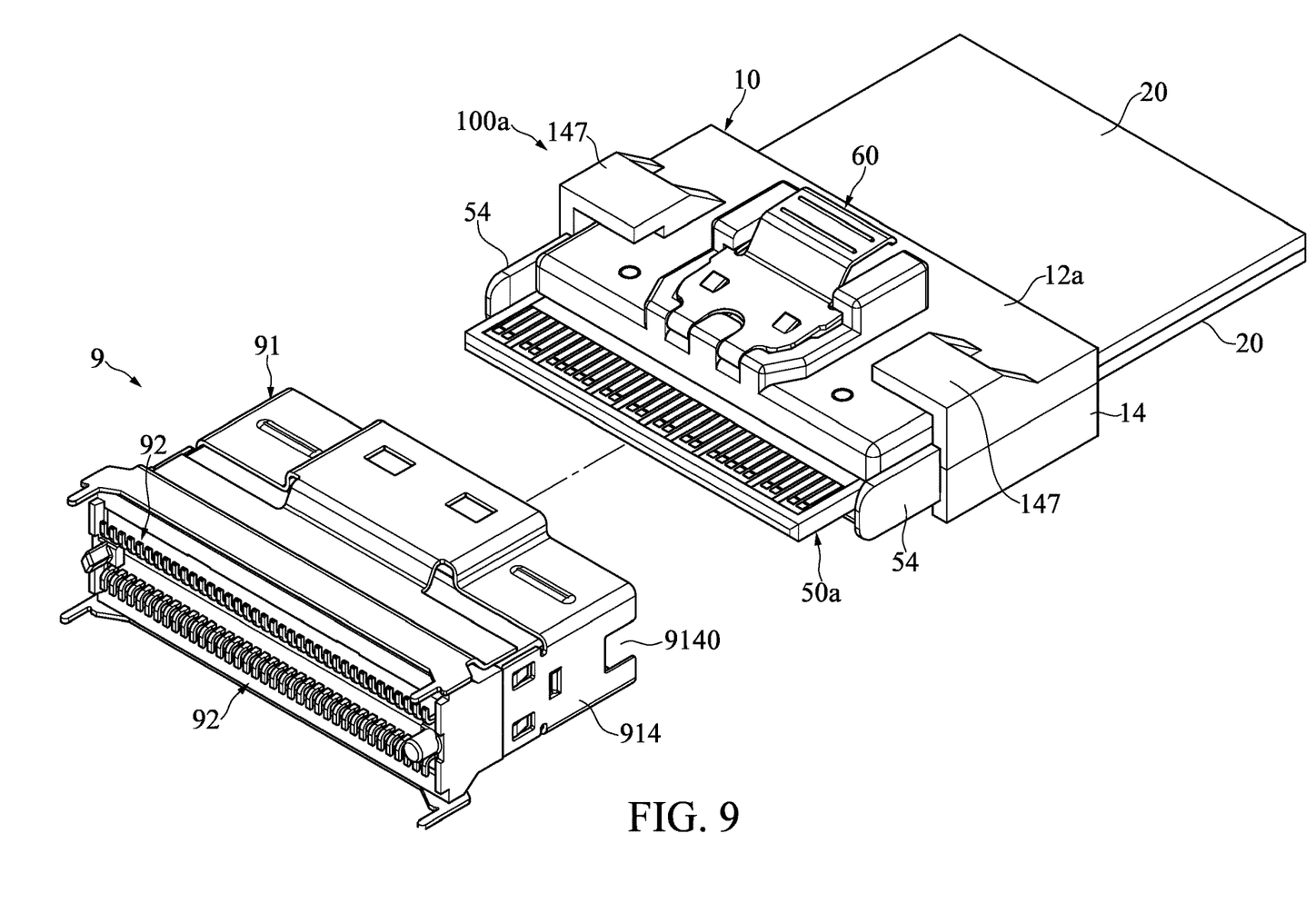
FIG. 9 is a perspective view of the plug connector and a socket according to the second embodiment of the present disclosure.
Figure 10:
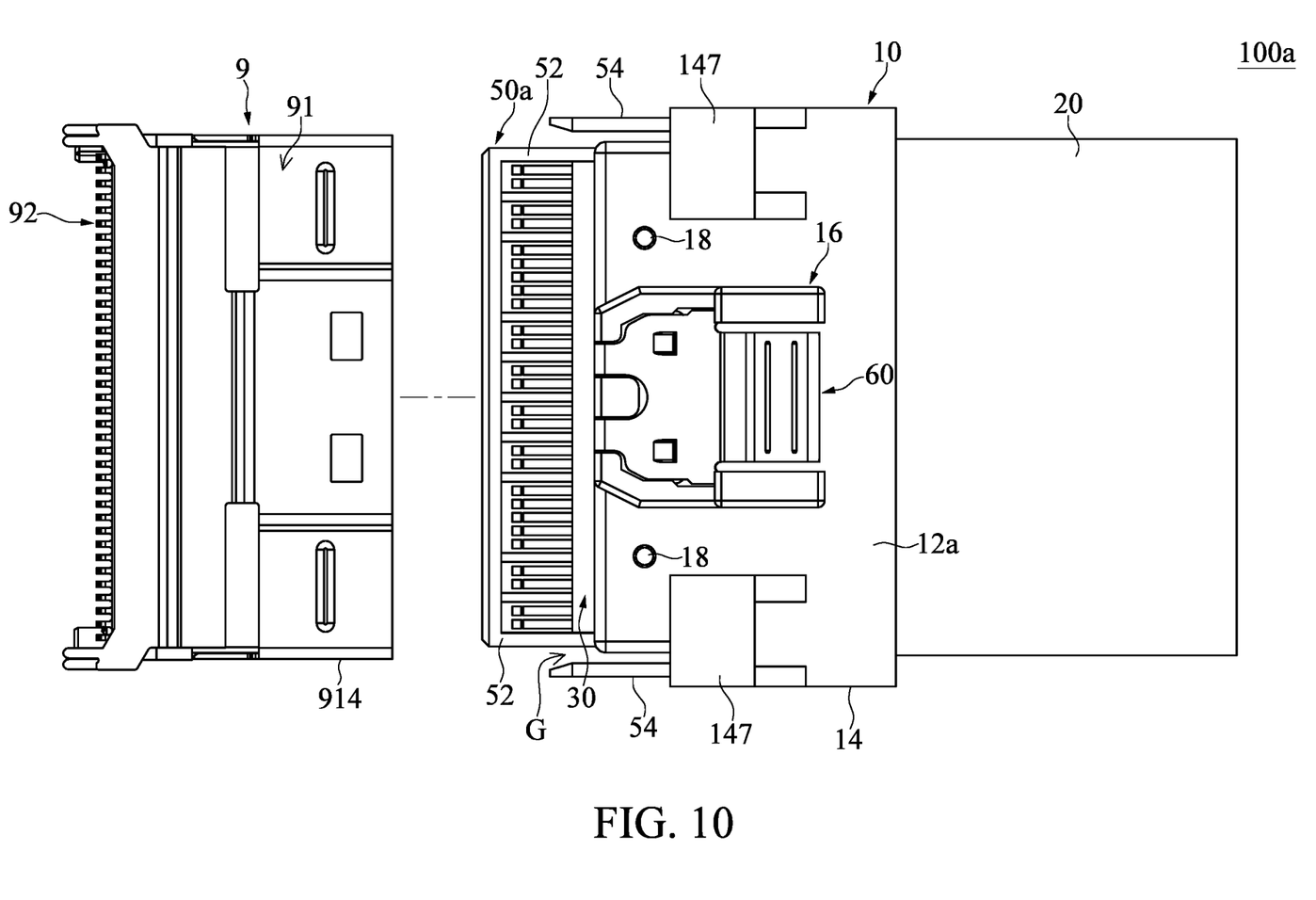
FIG. 10 is a top view of the plug connector and the socket according to the second embodiment of the present disclosure.

Referring to FIG. 8 to FIG. 10, a second embodiment of the present disclosure provides a plug connector 100a. The main difference between the present embodiment and the first embodiment resides in the protection member 50a, in which the protection member 50a further includes a pair of positioning side panels 54, and each of the positioning side panels 54 is formed by extending an outer side of the longitudinal arm 52 of the protection member 50a. Specifically, each of the positioning side panels 54 is respectively connected to the outer side of the widened part 531 at the end of the longitudinal arm 52. As shown in FIG. 10, two gaps G are separately formed between the positioning side panel 54 and the longitudinal arm 52 to correspond to the side panels 914 of the socket connector 9.

More specifically, each of the positioning side panel 54 includes a transverse connection part 541 and a side positioning part 542. The transverse connection part 541 is formed by extending the longitudinal arm 52 outward, and the side positioning part 542 is formed by extending in the insertion direction. In detail, the transverse connection part 541 extends vertically outward from the widened part 531, and the side positioning part 542 is perpendicular to the transverse connection part 541 and parallel to the side wall 14 of the insulation base 10.

As shown in FIG. 8, corresponding to the structure of the protective member 50a, a mating slot 146 is formed on the inner side of each of the side walls 34 of the insulation base 10, and the transverse connection part 541 of the positioning side panel 54 is received in the mating slot 146. As shown in FIG. 9, a position of the side positioning part 542 corresponds to a front end surface of the side wall 14 of the insulation base 10. The thickness of the side positioning part 542 is less than or equal to the thickness of the side wall 14 of the insulation base 10.

In addition, two stopping and grounding parts 32c of the circuit board 30 in the present embodiment are in the same shape.

Furthermore, in the present embodiment, an auxiliary top positioning wall 147 is extended inward from a top edge of the side wall 14 of the insulation base 10 in a direction parallel to the top wall 12a. When the plug connector 100a and the socket connector 9 are mated in the present embodiment, in addition to a positioning effect in a vertical direction being improved by the pair of positioning side panels 54 of the protective member 50a, the auxiliary top positioning wall 147 can abut against the housing 91 of the socket connector 9 from above to improve a positioning effect in a horizontal direction.

An advantage of the present embodiment is that, in addition to the beneficial effects of the two aspects described in the first embodiment, the protective member 50a can provide a more stable connection between the plug connector 100a and the socket connector 9, so that shaking between the plug connector 100a and the socket connector 9 can be avoided.

Third Embodiment

Figure 11:
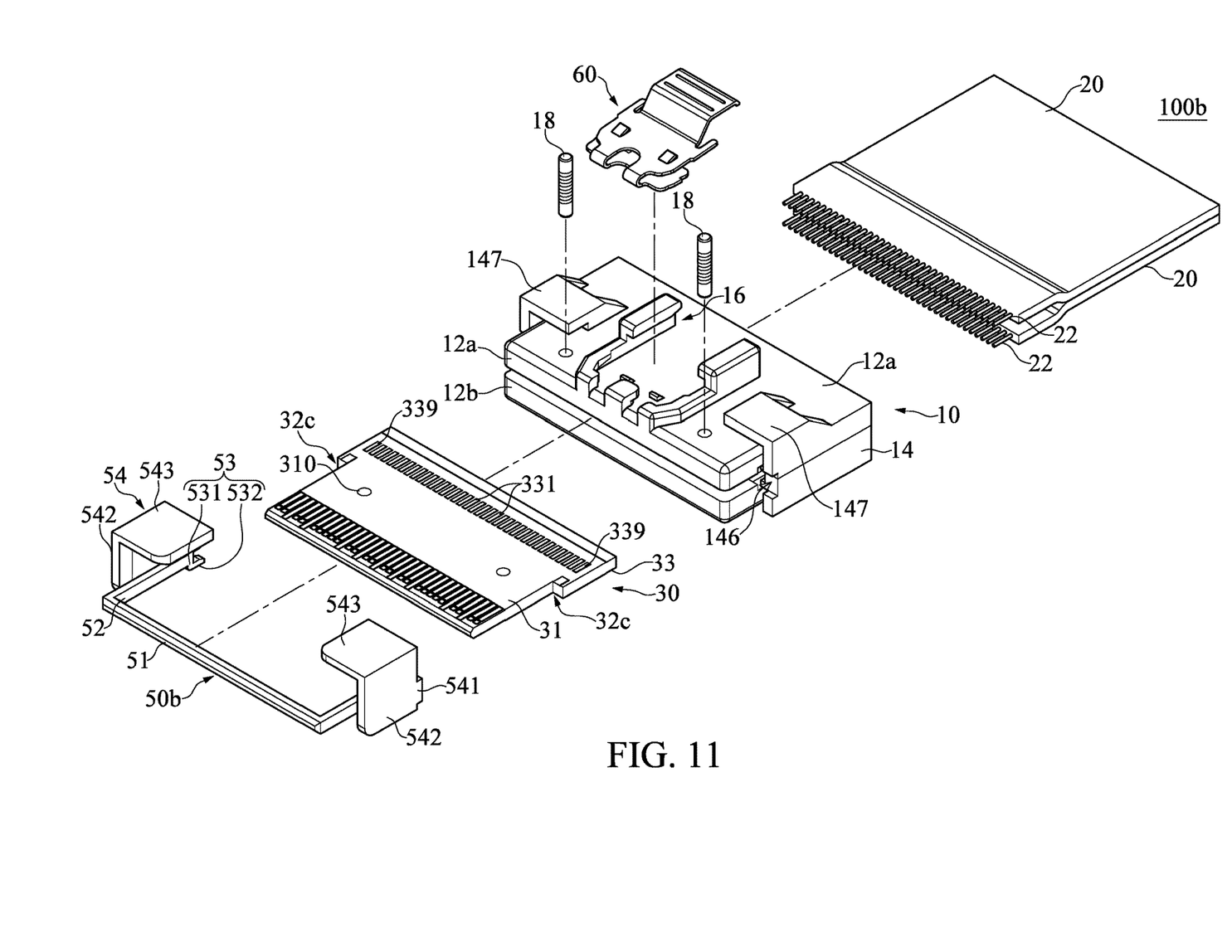
FIG. 11 is an exploded view of a plug connector according to a third embodiment of the present disclosure.
Figure 12:
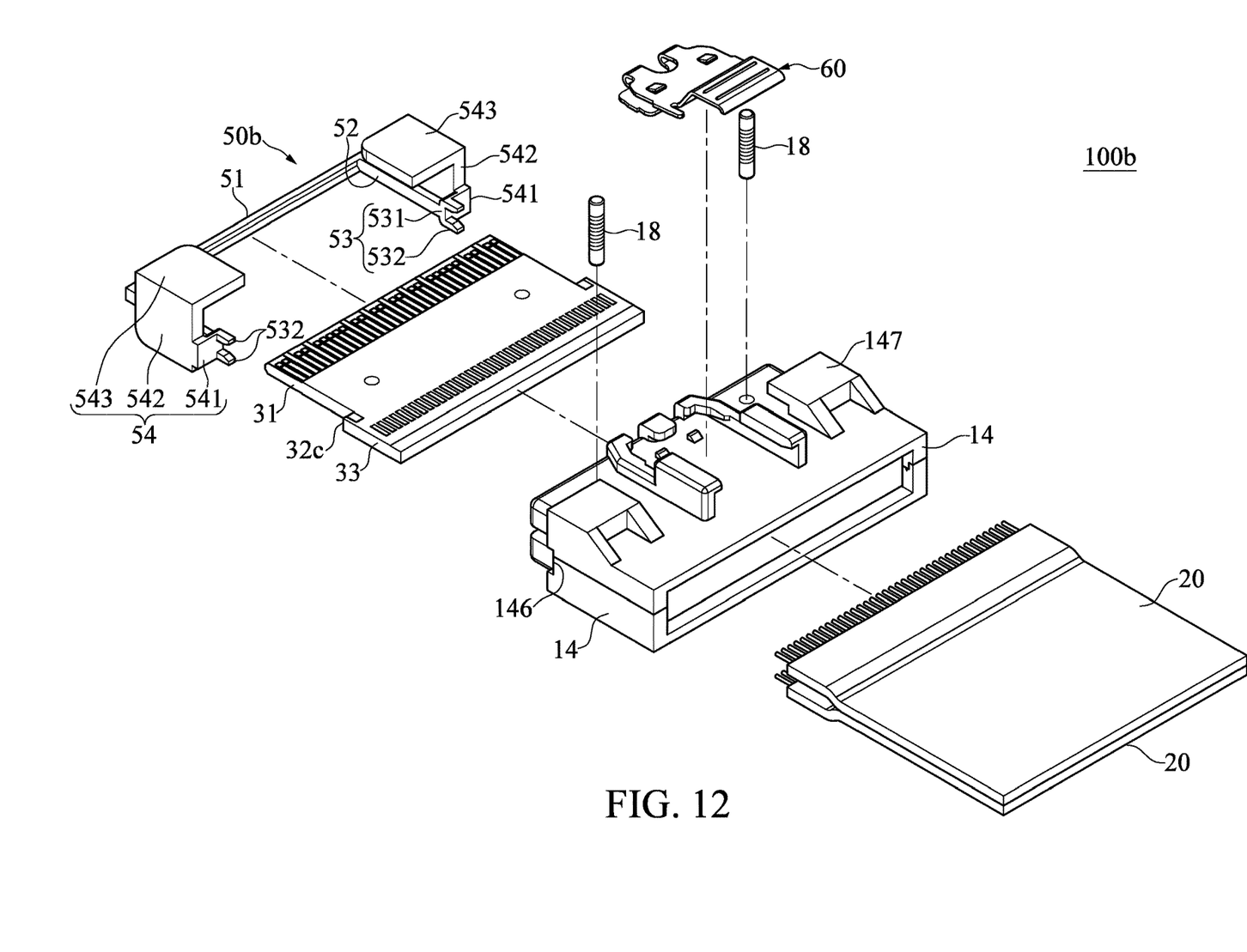
FIG. 12 is another exploded view of the plug connector according to the third embodiment of the present disclosure.
Figure 13:
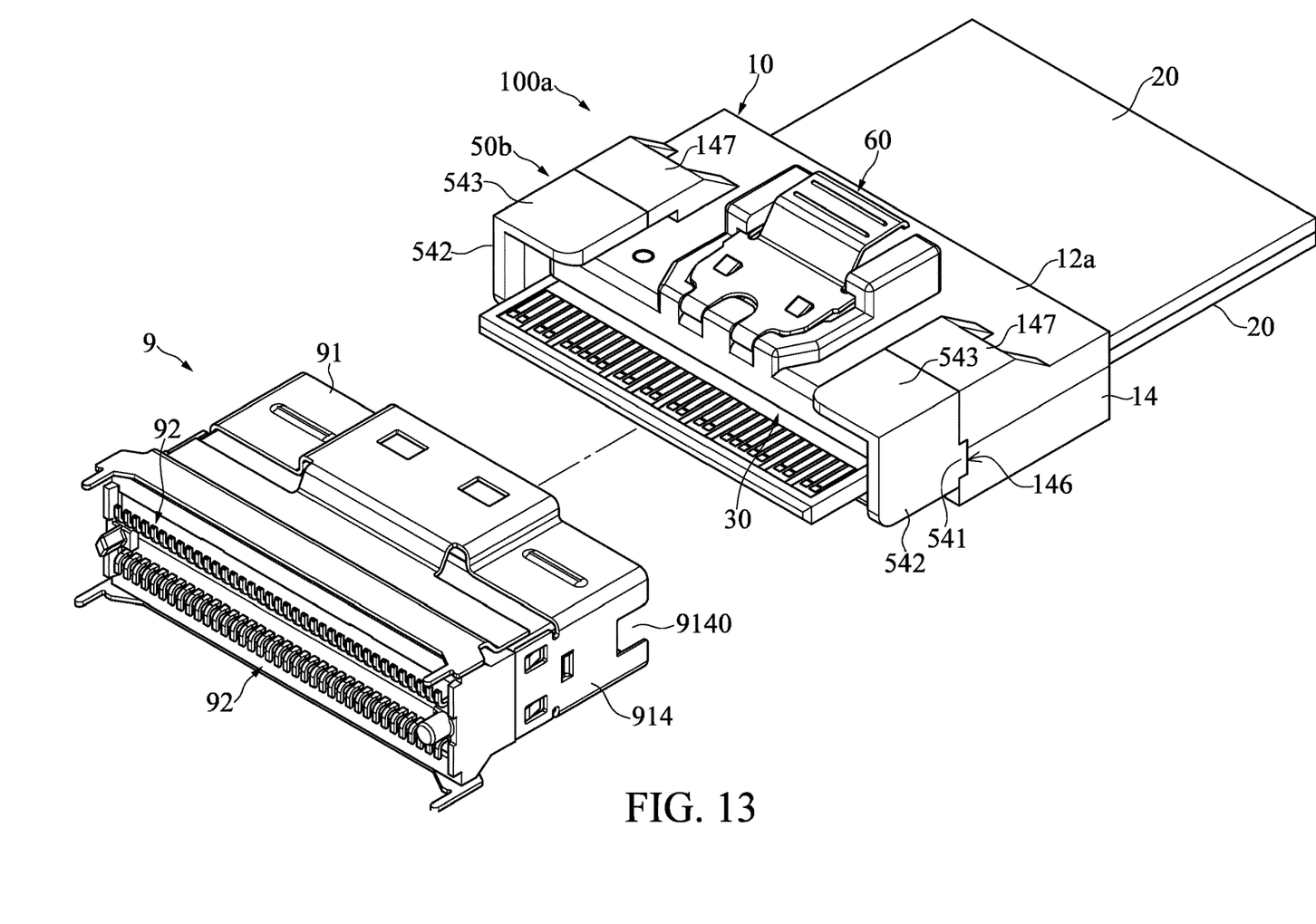
FIG. 13 is a perspective view of the plug connector and a socket according to the third embodiment of the present disclosure.

Referring to FIG. 11 to FIG. 13, a third embodiment of the present disclosure provides a plug connector 100b. The main difference between the present embodiment and the second embodiment resides in the protection member 50b. Compared with the protective member 50a of the second embodiment, each positioning side panel 54 of the protective member 50a includes a top positioning part 543 in addition to the transverse connection part 541 and the side positioning part 542. In which, the top positioning part 543 is perpendicular to the side positioning part 542 and extends inward from a top end of the side positioning part 542 in a direction parallel to the circuit board 30.

The insulation base 10 of the present embodiment is similar to the one of the second embodiment; each front end surface of the sidewalls 14 of the insulation base 10 is recessed to form the mating slot 146. The transverse connection part 541 is engaged in the mating slot 146. The position of the side positioning part 542 corresponds to the front end surface of the side wall 14 of the insulation base 10. The thickness of the side positioning part 542 is approximately equal to the thickness of the side wall 14 of the insulation base 10. A position of the top positioning part 543 corresponds to the auxiliary top positioning wall 147 of the insulation base 10, and the thickness of the top positioning part 543 is approximately equal to the thickness of the auxiliary top positioning wall 147 of the insulation base 10.

Compared with the second embodiment, in the present embodiment, the top positioning part 543 cooperates with the auxiliary top positioning wall 147 to abut against the housing 91 of the socket connector 9 to further improve the positioning effect in the horizontal direction.

BENEFICIAL EFFECTS OF EMBODIMENTS

In conclusion, one of the beneficial effects of the present disclosure is that the plug connector provided in the present disclosure includes the protective member located on the front and two sides of the circuit board. The protective member not only can protect the circuit board but can also provide the grounding effect by connecting to the ground line of the circuit board. In which, the protective member for protecting the circuit board can replace the gold finger of the circuit board and to be in electrical contact with the terminal of the socket, thereby reducing the area of the circuit board such that the size of an interface plug can be maintained in conformity to standard specifications.

In addition, the protective member can further include the positioning side panels to further improve the positioning effects between the plug connector and the socket connector in the vertical and the horizontal directions.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A plug connector including a protective member for replacing a gold finger, comprising:
    an insulation base including a top wall, a bottom wall and a pair of side walls that jointly surround to form an accommodating space in an interior thereof along an insertion direction of the plug connector;
    a cable terminal block including at least one cable, each of the at least one cable including a plurality of conductors;
    a circuit board including a contact section and a solder section, in which the solder section is connected with the contact section, a width of the solder section is greater than a width of the contact section, and a pair of stopping and grounding parts are respectively formed on both sides of the solder section adjacent to the contact section; wherein the circuit board includes a plurality of conductive pads located on at least one surface of the contact section and a plurality of solder pads located on at least one surface of the solder section, and a ground pad is disposed on at least one surface of each of the pair of stopping and grounding parts, the contact section protrudes from a front edge of the insulation base and exposes the plurality of conductive pads, the plurality of conductors of the at least one cable are separately soldered to the plurality of solder pads, and the location of the ground pads protruding from two sides of the contact section;
    a grip fixed to the insulation base; and
    the protective member being clipped to the contact section of the circuit board, wherein the protective member includes a transverse arm and a pair of longitudinal arms, the pair of longitudinal arms are connected to both ends of the transverse arm, and each end of the pair of longitudinal arms is separately soldered to the solder pads of the pair of stopping and grounding parts.

2. The plug connector according to claim 1, wherein a number of the conductive pads is less than a number of the solder pads, and the ground pad is aligned with two outermost solder pads among the plurality of solder pads.

3. The plug connector according to claim 1, further comprising at least one fixing pin penetrating the top wall and the bottom wall of the insulation base and the circuit board so that the circuit board is fixed to the insulation base.

4. The plug connector according to claim 1, wherein a groove is formed on an inner side of the transverse arm of the protective member, the groove abuts against a front end surface of the contact section, and inner sides of the pair of longitudinal arms abut against two sides of the contact section, respectively.

5. The plug connector according to claim 4, wherein a connection structure is formed at each of the ends of the longitudinal arms, and the connection structures are separately soldered to the ground pads on a top and a bottom surface of the pair of stopping and grounding parts.

6. The plug connector according to claim 5, wherein each of the connection structures includes a widened part and a pair of solder parts, each the widened parts is connected to one of the ends of the longitudinal arms, and the pair of solder parts respectively extend from two sides of the widened part in a direction parallel to the longitudinal arms.

7. The plug connector according to claim 6, wherein the protective member further includes a pair of positioning side panels, each of the positioning side panels respectively extends from an outer side of the longitudinal arm of the protective member, one gap is formed between one of the pair of positioning side panels and one of the pair of longitudinal arms, and one another gap is formed between another one of the pair of positioning side panels and another one of the pair of longitudinal arms.

8. The plug connector according to claim 7, wherein each of the positioning side panels includes a transverse connection part and a side positioning part, the transverse connection part is formed by extending the longitudinal arm outward, and the side positioning part is extended along the insertion direction.

9. The plug connector according to claim 8, wherein each of the positioning side panels further includes a top positioning part perpendicular to the side positioning part and extends inwardly from a top edge of the side positioning part in a direction parallel to the circuit board.

10. The plug connector according to claim 1, wherein the grip is fixed to the top wall of the insulation base, and the grip includes an upper panel, a lower panel, and an operation part extending upward from the upper panel, and wherein a front edge of the upper panel is bent to connect to the lower panel, and the lower panel of the grip is fixed to the top wall of the insulation base.

* * * * *